United States Patent [19]

Hecht et al.

[11] Patent Number: 5,485,350
[45] Date of Patent: Jan. 16, 1996

[54] COOLED ELECTRONIC HOUSING

[75] Inventors: Franz Hecht, Herzogenaurach; Bernd Kurze, Erlangen; Mona Hentschel, Weisendorf; Volker Schinn, Hallerndorf; Thomas Weichselbaum, Nürnberg; Hans-Werner Kranz, Baiersdorf, all of Germany

[73] Assignee: Siemens Aktiengesellschaft, München, Germany

[21] Appl. No.: 342,185

[22] Filed: Nov. 18, 1994

[30] Foreign Application Priority Data

Nov. 26, 1993 [DE] Germany .................. 43 40 244.5

[51] Int. Cl.⁶ ........................................... H05K 7/20
[52] U.S. Cl. .................. 361/692; 165/80.3; 257/722; 361/695; 361/719; 363/141; 454/184
[58] Field of Search ................ 312/223.1; 454/184; 363/141; 257/706, 707, 712, 713, 721, 722; 165/122, 126, 80.3, 185; 361/689, 690, 692, 694, 695, 697, 703, 704, 707–710, 717–719, 736, 752

[56] References Cited

U.S. PATENT DOCUMENTS

| | | | |
|---|---|---|---|
| 4,287,764 | 9/1981 | Staab | 73/431 |
| 4,525,769 | 6/1985 | Lehmann | 361/386 |
| 4,620,263 | 10/1986 | Ito | 361/383 |
| 4,772,999 | 9/1988 | Fiorina | 363/141 |
| 5,091,823 | 2/1992 | Kanbara et al. | 361/384 |
| 5,414,591 | 5/1995 | Kimura | 361/695 |

FOREIGN PATENT DOCUMENTS 0356991 3/1990 European Pat. Off. .
0449640 10/1991 European Pat. Off. .
3412510 10/1987 Germany .
8911408 3/1991 Germany .

OTHER PUBLICATIONS

Siemens Prospectus Simovert PX–*Spannungszwischenkreis–Umrichter 6SE60 für dynamische, bürstenlose Antriebe*, 1991 pp. 1–8.

Siemens Prospectus Simovert PM *Das modulare Umrichtersystem 6SM1 für Mehrmotorenantriebe, 3 bis 60 KVA, Ausgangsfrequenz bis 500 Hz*, 1991, pp. 1–16.

Siemens Katalog DA66.2 1992: *Spannungszwischenkreis–Umrichter SIMOVERT P für drehzahlveränderbare Drehstromantriebe*.

Primary Examiner—Gerald P. Tolin
Attorney, Agent, or Firm—Kenyon & Kenyon

[57] ABSTRACT

A housing may hold a control device equipped with heat-producing components. A die-cast housing includes a side wall, a rear wall, a bottom, a cover, a front strut, a cooling element and an air guide device, a cover plate and a front cover. The cooling ribs of the cooling element run parallel to the rear wall, end in the plane of the side wall, and are covered with a bulkhead plate. The bottom and the cover are each provided with perforations for removing heat from the front housing half and openings through which connection lines may be passed. The front strut serves as a lateral frame part for the removable cover plate that covers a lateral access opening of the housing, and for the front cover which can close off the front-side opening of the housing. This results in a housing for a control device in book size format, where the number of assembly parts, the assembly effort and the assembly time are significantly reduced.

18 Claims, 8 Drawing Sheets

COOLED ELECTRONIC HOUSING

BACKGROUND OF THE INVENTION

The present invention provides a housing to hold a control device that includes heat-producing components. The control device can be, for example, an inverter, a converter stage, an inverse rectifier, or another control device that comprises electrical and/or electronic elements.

German patent 34 12 510 discloses a die-cast aluminum housing that comprises a rear wall and two side walls. The rear wall is provided with cooling ribs, where a cooling fan or cooling blower is affixed at the bottom of the housing. In the outside walls of the housing, openings are broken or formed at the top and the bottom of the housing, which are provided to hold interchangeable housing walls, which are provided with openings and ducts for connecting cables. The heated air located in the interior rises upwards due to convection, and exits through the top openings, while outside air enters through the bottom openings. The electrical components, for example diodes and transistor modules, are part of the control device and are affixed so that they are in good heat-conductive contact with the rear wall, which has cooling ribs on the outside. A printed circuit board or printed board assembly, on which electronic components for the control device are installed, is affixed in the housing in removable manner. The side walls are structured in such a way that they enclose the cooling ribs and the housing can be installed on a carrier plate, resulting in closed cooling channels. The removable cover plate is made of plastic and completely seals the housing when the control device is assembled in the housing and wired.

European patent application 0 356 991 discloses an inverter that consists of a two-part housing, namely a lower and an upper box. The lower box consists of die-cast aluminum with cooling ribs on one outer side, where the cooling ribs are enclosed towards the side and a cooling fan is affixed at the bottom of this lower box. The open cooling channels formed by the cooling ribs are closed when the inverter is installed on an assembly plate. The heat-producing components of the inverter are installed on the bottom of the lower box. In addition, this bottom has a holder device for an intermediate circuit capacitor, the capacitors of which project into the stream produced by the fan. This lower box of the housing is hermetically sealed by a cover plate which is structured as a cooling element. A control and regulation circuit board is installed on this cover plate, at a distance from it, and is electrically connected with the components in the lower box by means of cables. The upper box is structured as a lid which is connected with the lower box in removable manner. A control panel is housed in this lid. This lid consists of an insulating material, for example plastic.

European patent application 0 449 640 discloses an electrical device that has a cooling element that has several openings. These openings hold electrical components and these components electrically connected with each other by means of a printed circuit board. A control and regulation circuit board is affixed at a distance from this circuit board. A lid of insulating material covers this circuit board and is removably connected with the cooling element.

Siemens brochure "SIMOVERT PX—Spannungszwischenkreis-Umrichter 6SE60 für dynamische, bürstenlose Antriebe" [SIMOVERT PX—Intermediate circuit voltage converter 6SE60 for dynamic, brushless drives], Order No. E20001-P181-A419 discloses housings for converters in a so-called book size format. They allow several housings to be placed next to one another, for example for multi-motor drives. In a housing in the book size format, the supporting element is the cooling element. The housing is structured to be enclosed on all sides, and is made of sheet steel, in order to ensure a high level of electromagnetic compatibility. Such devices can easily be installed in a cabinet wall. All connections are made from below, via screwless cage drawspring terminals. The control panel, consisting of several parameter setting keys and a display, is housed in a frontal narrow side of the housing. The cooling element at the rear narrow side of the housing has an attachment plate which has a hanger at the top end and an attachment at the bottom end. This plate also seals off the open cooling channels.

From the Siemens brochure "SIMOVERT PM—Das modulare Umrichtersystem 6SM1 für Mehrmotorantriebe" [SIMOVERT PM—The converter system 6SM1 for multi-motor drives], Order No. E20001-P181-A439, a modular converter system is known which consists of a feed unit, central electronics, a direct-current intermediate circuit rail and up to sixteen inverter units. The inverter modules have the same height and therefore the same connection and attachment grid dimensions, and are connected to the direct-voltage rail via a snap connector. The components of the inverter modules include an intermediate circuit fuse, intermediate circuit capacitors and choke, a transistor pulse converter, an output choke, a control and regulation electronics module in an electronics box with a free space for optional modules, fan, a cooling element with temperature monitor and a control terminal strip. The support element is, once again, the cooling element, to which the side walls are attached. These side walls serve as carrier plates for the electronics box and the electrical module, which comprises a power section, several control modules, intermediate circuit capacitors and chokes, etc. A front cover, a cover and bottom plate are still removably attached to these parts (cooling element, side walls). The bottom and cover plate have perforations to allow heat to be removed from the interior of the module.

In all these housing types, the housing consists of several parts which must be connected with one another after control device components have first been attached to them. The cooling element serves as the support element to which the other components or parts of a control device are attached by means of assembly parts (i.e., spacers, assembly plates). When this assembly technology is used, some components of the control device are no longer easily accessible. In addition, the assembly of such a housing is very complicated and time-intensive, comprising many different assembly steps.

SUMMARY OF THE INVENTION

The present invention provides a housing to hold a control device which can be assembled in significantly less time and substantially less effort than known housings.

This is achieved by providing a housing capable of holding a control device that is comprised of electrical and electronic components that produce heat. The housing is die-cast, and is comprised of side and rear walls, a bottom, a cover, a opening in front delimited by a strut, a cooling element, a device to guide air through the cooling element, a cover plate and a cover for the front side.

An electronics box that includes a control and regulation module is attached to the housing such that its frontal opening runs parallel to the housing's frontal opening.

The heat-producing components are connected to an electrical module running parallel to the cover plate. A plate of insulating material is arranged between the circuit board of the electrical module and the cover plate. The cover plate is made of metal and rests on a shoulder that runs around the circumference of the side access opening.

The front strut between the bottom and the cover provides a lateral frame part for the removable cover plate that covers a lateral access opening of the housing, and for the removable cover for the front of the housing. The front strut is structured so that a rotating hinge of the front cover can be attached to it. The front cover houses a control panel.

The cooling element includes ribs that run parallel to the rear wall and terminate on one side by a bulkhead plate. The cooling channels between the ribs of the cooling element begin at the bottom of the housing at the air guide device and end at the top. Both the bottom and top covers are provided with perforations to allow air into and out of the cooling element, respectively. The perforations are provided with a grating cover in the vicinity of the air guide device.

The bottom and top covers are each further provided with an opening to admit electrical connection lines. These openings can occur in a molded part that provides a recess that holds a plug-in connector designed to accommodate a cooling fan. The cooling fan is positioned at the entrance of the air guide device.

The bottom and the top of the die-cast housing each have a contact rib parallel to the openings through which electrical connections are passed. A threaded bore is provided adjacent to the contact rib. These are provided so that a splash protection plate, a shield plate, or connection funnels can be attached to the bottom or to the cover. The contact rib and bore can take the form of a contact shoulder around the circumference of the perforations and a nearby threaded bore.

Stays are provided in the vicinity of the electrical connector openings to serve as holder devices for power connection terminals that are connected to the electrical module of the control device.

Connection domes are provided on the inside of the side wall to attach components of the control device to the die-cast housing.

The rear wall of the housing is provided with a hangar in the top part and an attachment in the bottom part. The hangar allows the housing to be suspended on a standard carrier rail, such as a G rail. The hangar can be comprised of two hooks. The attachment can be a flange that allows the suspended device to be removably attached to a flat surface, such as the rear wall or a cabinet or a carrier plate.

In another embodiment, a separate cooling channel is arranged between the cooling element and the rear wall of the die-cast housing, into which at least one control device holder can project its components to be cooled. The bottom and cover of the housing are each provided with perforations to allow air to pass through the separate cooling channel.

Because the die-cast housing comprises not only a side wall, a rear wall, a bottom, a cover and a front strut, but also a cooling element provided with several cooling ribs, with an air guide device, only two covers have to be installed, namely one to cover a lateral access opening of the housing and one to cover the opening on the front. This structure allows a larger access opening to the interior of the die-cast housing, simplifying the assembly of the components of the control device. By integrating the cooling element into the rear housing part, the housing is divided into two parts. This creates two different assembly planes, so that a uniform assembly surface with a large area is obtained when the heat-producing components are assembled onto the cooling element and the electronics box with a control and regulation module. A pre-assembled electrical module (intermediate circuit capacitors and choke, a power section, relays, control modules, power connection terminals, etc.) is installed on this surface. It is placed in such way that its components project into the interior of the housing, its solder side forming a flat end wall of the housing. On this end wall, a removable, electrically insulating cover plate is attached to the die-cast housing. The present invention provides a holder device for a fan integrated into the die-cast housing, so that the fan can be readily assembled in only a few steps.

Thus the time and effort required to assemble the book-size housing provided by the present invention are significantly reduced. Final assembly is also very easy because the components of the control device are pre-assembled.

BRIEF DESCRIPTION OF THE DRAWINGS

For further explanation, reference is made to the drawing, in which several embodiments of the housing according to the invention are shown schematically.

DETAILED DESCRIPTION

In the following description of several embodiments of the housing according to the present invention, the same elements are given the same reference numbers. In order to avoid repetition, the descriptions of the second and third embodiment (FIG. 5 to FIG. 8) only point out the differences as compared with the first embodiment shown in FIGS. 1 and 4.

Figure 1:
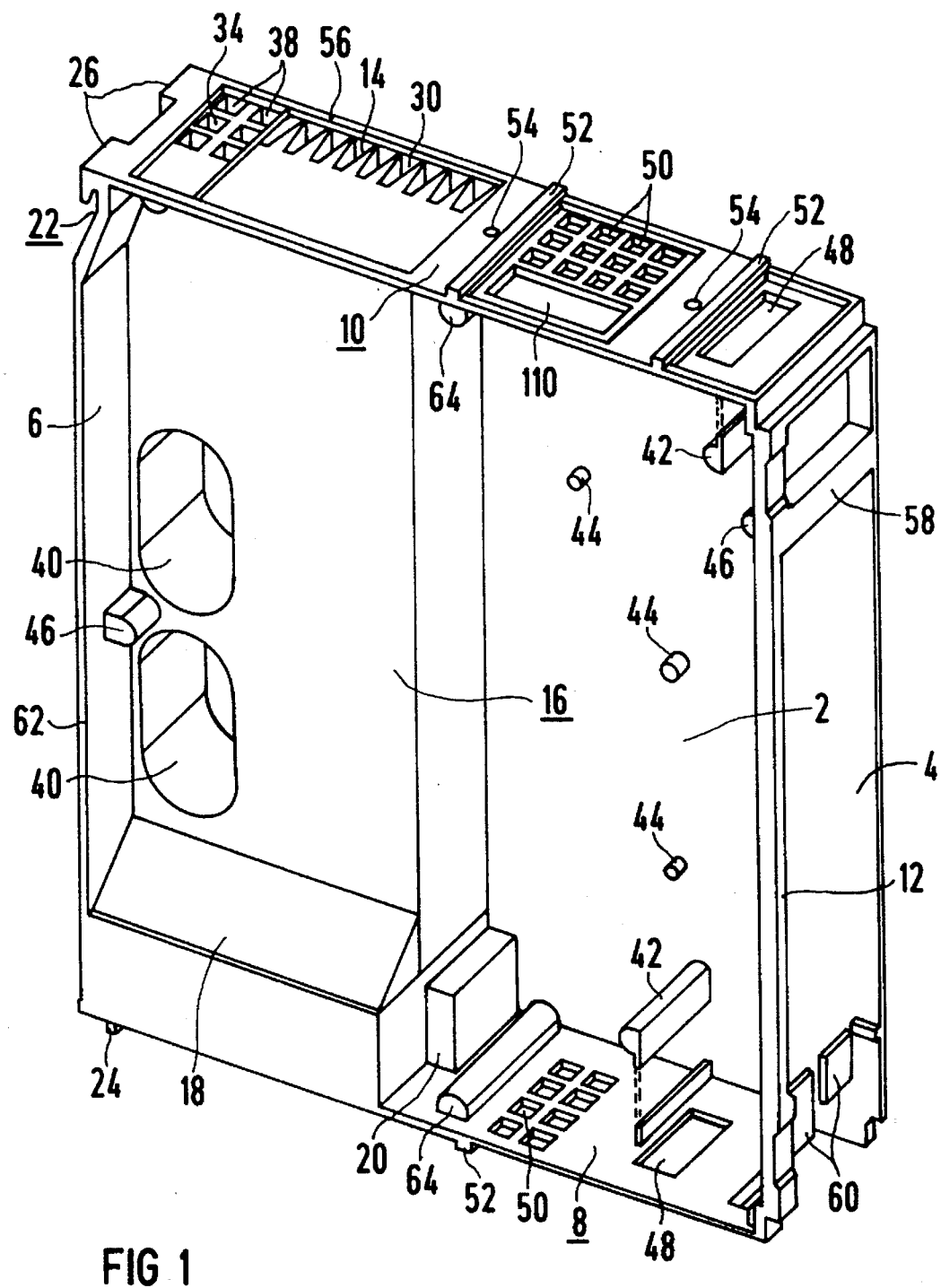
FIG. 1 shows a perspective view of a housing according to an embodiment of the present invention, of a compact device, size I.
Figure 2:
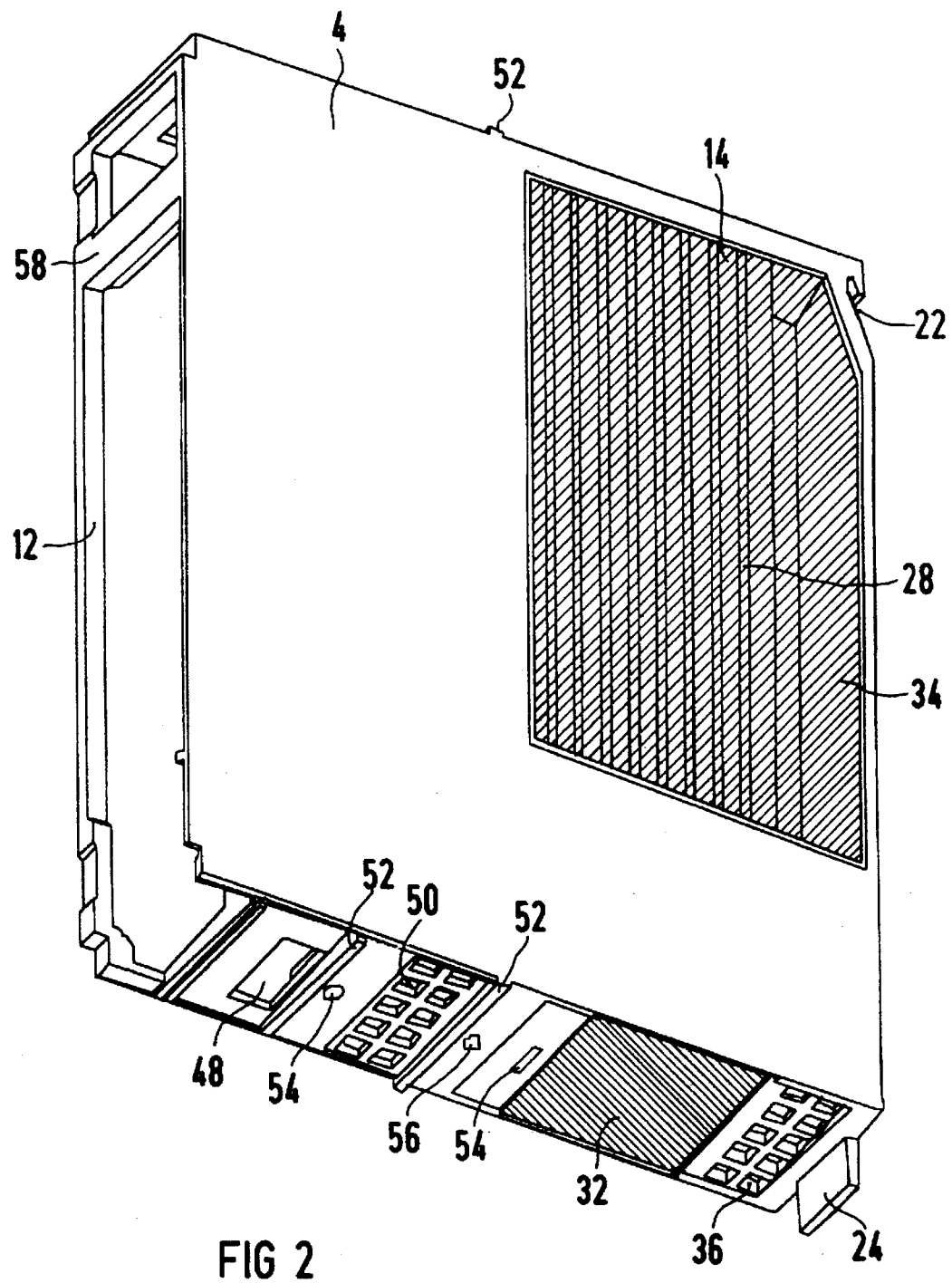
FIG. 2 shows a related perspective view of the housing according to FIG. 1 at a slant from the bottom.

FIG. 1 shows a perspective view of a die-cast housing according to the present invention at a slant from above, while FIG. 2 shows a perspective view at a slant from below. In the representation according to FIG. 1, a cover plate which closes off a lateral access opening 2 of the housing, and a front cover which has a control unit consisting of several parameter setting keys and a display, cannot be seen. The die-cast housing according to the invention, particularly an aluminum die-cast housing, comprises a side wall 4, a rear wall 6, a bottom 8, a cover 10, a front strut 12, a cooling element 16 provided with several cooling ribs 14, an air guide device 18 and a molded part 20. The material used for this die-cast housing is an aluminum alloy, such as AlSi 12.

The rear wall 6 of the housing is provided with a hanger 22 at the top part, and with an attachment 24 at the bottom part. The hanger 22 and the attachment 24 are integral parts of the rear wall 6. The hanger 22 is structured in such a way that its hooks are flush with the rear wall 6. A flange is provided as the attachment 24. By means of the hanger 22, the device (housing with a control device) can be suspended on a standard carrier rail, for example a G rail. By means of the attachment 24, the suspended device can be removably attached to a flat surface, for example the rear wall of a cabinet or a carrier plate.

The cooling element 16 is arranged in the rear part of the housing, in such a way that its cooling ribs run parallel to the rear wall 6 between the cover 10 and the air guide device 18. The height of the cooling element 16 approximately corresponds to half to two-thirds of the width of the housing. In structuring the cooling element 16, the dimensions of the heat-producing components (diodes, transistors, etc.) are taken into consideration. The cooling ribs 14 terminate on the plane of the side wall 4 and are covered by means of a bulkhead plate 28 (FIG. 2), forming cooling channels 30 open on the frontal side through which cooling air is forced by means of an air fan. Such an air fan is arranged in the entry region of the air guide device 18. Next to the entry region of the air guide device 18, the molded part 20 is located, which holds a plug-in connector. In this way, the air fan can be installed even when the housing is assembled. The air guide device 18 and the recess of molded part 20 are covered with a fan grating cover 32 (FIG. 2), which is screwed onto the air fan.

The air guide device 18 is structured in such a way that its rear is an integral part of the side wall 4 of the die-cast housing. The depth of the air guide device 18 in the entry region is equal to the width of the housing and is block-shaped. This is followed by an area limited in depth, which opens into the frontal cooling channels 30, located next to one another. The entry region of the air guide device 18 and the adjacent molded part 20 are essentially separated from one another.

It is evident from the representation in FIG. 1 that a separate cooling channel 34 is arranged between the cooling element 16 and the rear wall 6 of the die-cast housing, where cooling air enters through perforations 36 in the bottom 8 and then exits again through perforations 38 in the cover 10. In view of a simple casting shape, this separate cooling channel 34 is open towards the side wall 4 of the die-cast housing. This cooling channel 34 is also covered with a bulkhead plate, with the cooling channels 30 of the cooling element 16 and the separate cooling channel 34 being covered jointly by means of a bulkhead plate 28. At least one holder device 40 for components of the control device to be cooled projects into this cooling channel 34. These components are, for example, capacitors of an intermediate circuit capacitor, which are cooled by means of convection cooling. If convection cooling is no longer sufficient, the air guide device 18 can also extend across the access of the separate cooling channel 34, turning convection cooling into forced cooling.

In addition, in this representation of the housing according to FIG. 1, it is evident that the housing interior is divided into two parts, namely into one part in which the cooling element 16, the separate cooling channel 34 and the air guide device 18 are housed, and into a part in which the entire width of the housing is available. In this area, aids such as stays 42, connection domes 44 and bases 46 are provided, with a base 46 also being arranged in the rear part of the housing. The connection domes 44 are provided to attach components of a control device, where an electrical module of this control device can be connected with the die-cast housing by means of the base 46, in removable manner. The stays 42 serve as holder devices for power connection terminals which are connected with the electrical module of the control device.

So that connection lines can also be brought to and connected with these power connection terminals, the bottom 8 and the cover 10 of the housing each have an opening 48 in the immediate vicinity of these stays 42. In addition, the bottom 8 and the cover 10 each have perforations 50 in the region of the front housing half, to remove heat from this housing half. So that a splash protection plate or a shield plate or so-called scoops (connection funnels) can be attached to the bottom 8 or to the cover 10, the bottom 8 and the cover 10 are each provided with contact ribs 52 with related threaded bores 54, including a support shoulder 56 with a related threaded bore 54.

The front strut 12 forms a front left edge of the die-cast housing and connects the bottom 8 and the cover 10 with each other. A cross-strut 58 is inserted into the opening formed by the front strut 12 and the side wall 4, and there are two stays 60 in the lower part, which are attached to the side wall 4 and can be moved inward. A conductive shield of control lines can be attached to these stays 60. The front strut 12 is also formed in such a way that a rotating hinge of a front cover can be attached to it.

The cover plate, which has been left out for the sake of better clarity, rests against a continuous shoulder 62 along the access opening 2 in the assembled state. The removable attachment of the side cover is achieved via two or three attachment points which are located on ejector points 64.

Figure 3:
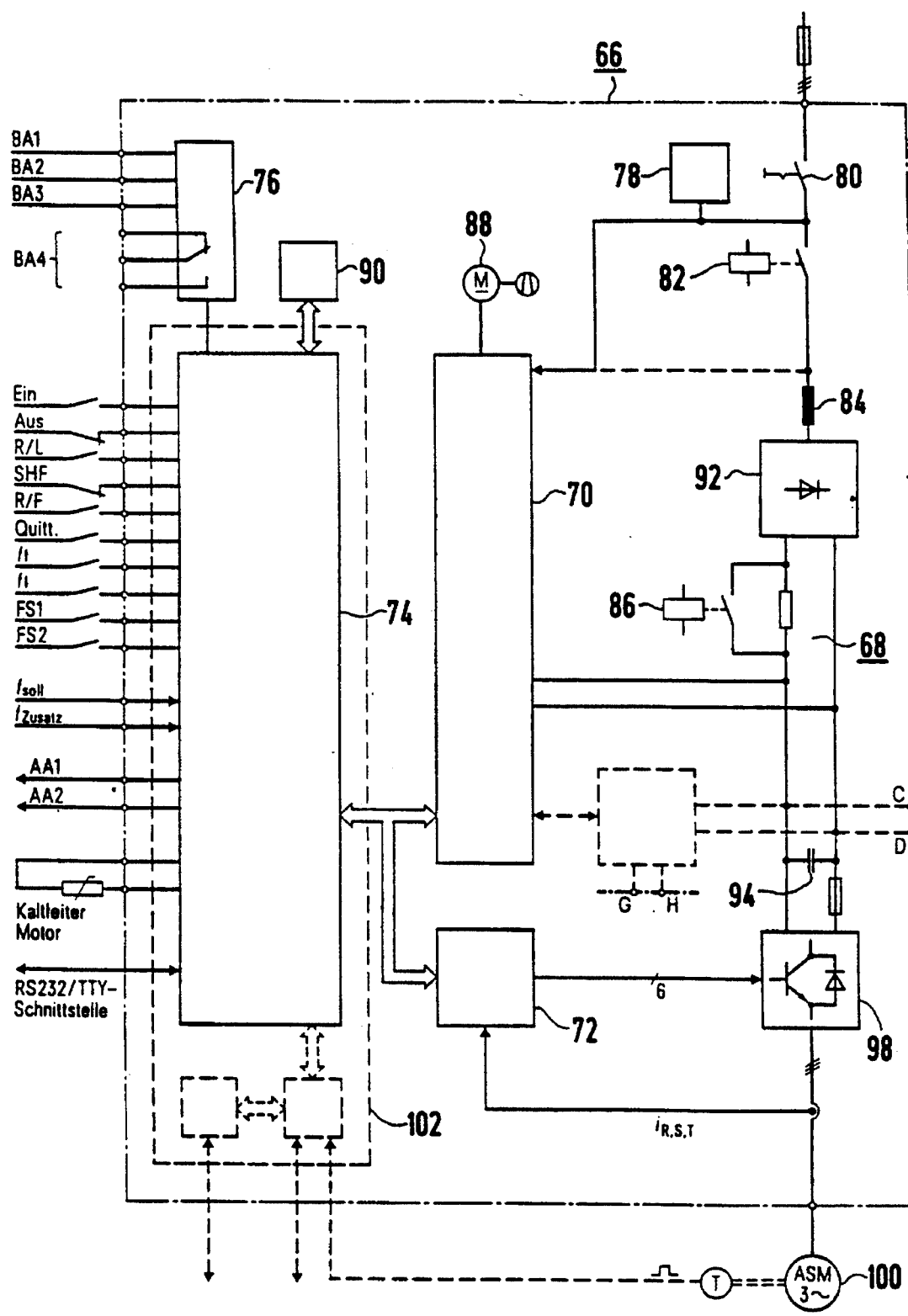
FIG. 3 shows an overall circuit schematic of a control device (converter) which is housed in the housing according to FIG. 1.
Figure 4:
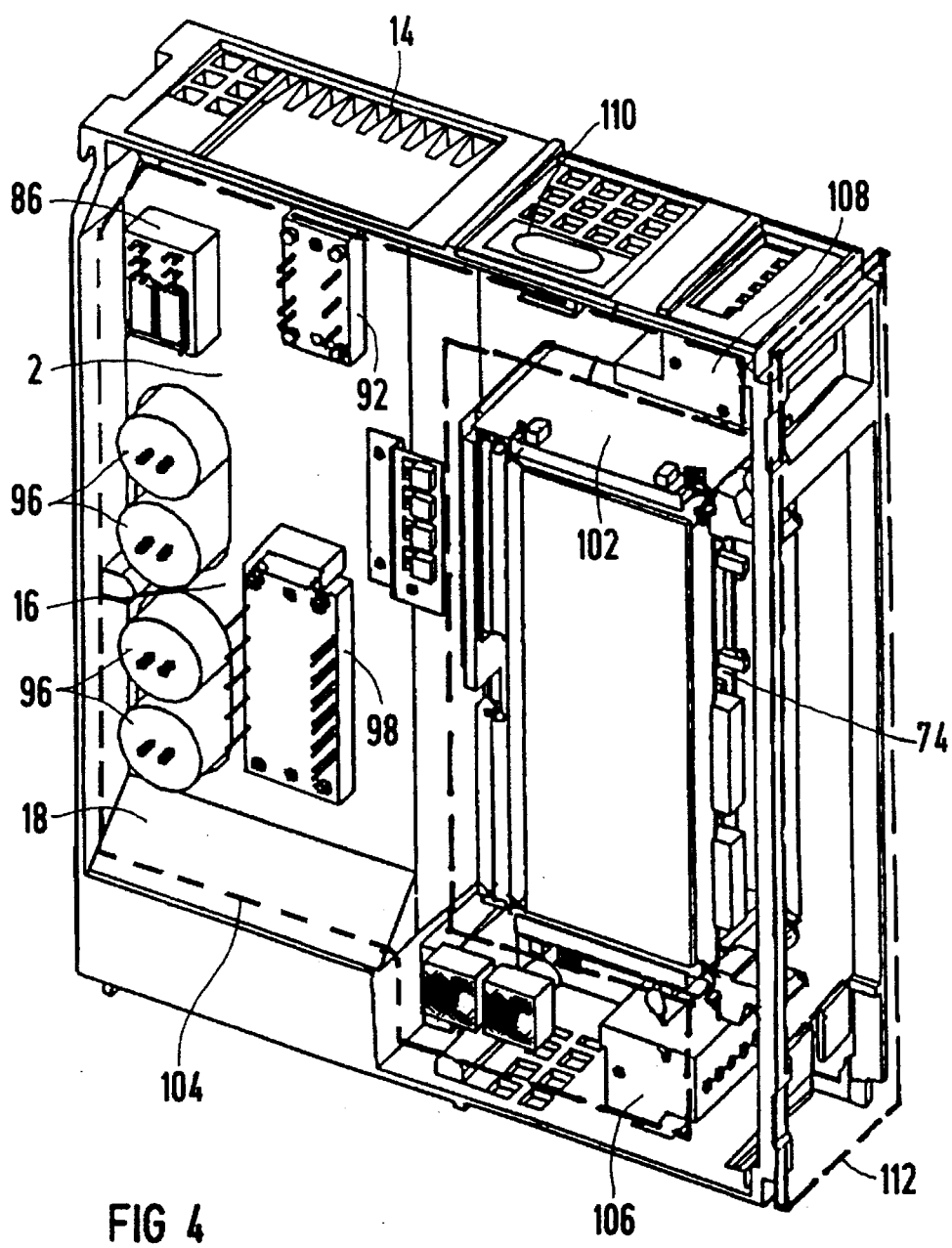
FIG. 4 shows a partially assembled device, size I, according to FIG. 1.

FIG. 3 shows, in schematic form, an overview of a circuit of a known control device 66 which can be housed in the housing. This control device 66 is shown in greater detail and described in the Siemens catalog "DA 66.1-1992," particularly on pages 2/1 to 2/22 and 2/43 to 2/57. FIG. 4 shows the components of this control device 66 in the die-cast housing according to the invention. The control device 66 is, for example, a converter which contains a power section 68, a power supply 70, a control 72, a control and regulation module 74, a relay module 76, an interference filter 78, a power switch 80, a power commutation choke 84, a pre-loading relay 86, a fan 88 and a control panel 90. The power section 68 consists of a rectifier 92 to rectify the line voltage, an intermediate circuit choke and an intermediate circuit capacitor 94, consisting of several capacitors 96, for example four capacitors 96 (FIG. 4), to smooth the intermediate circuit voltage and to uncouple an inverter 98 from the power line.

For inverters from 16 kVA, for example, the input section and the intermediate circuit consist of a power commutation choke 84, a rectifier 92 and the intermediate capacitor 94. For inverters from 22 kVA, for example, the rectifier 92 is structured as a semi-controlled bridge, the pre-loading resistor and the pre-loading relay 86 are eliminated.

The intermediate circuit is passed out via the terminals C and D. In this way, the intermediate circuits can be connected with one another to equalize the energy between different inverters connected to the same power line.

The three phases of the inverter 98 are composed, for example, of power converter valves which can be shut off, for example transistor modules, IGBT modules with the related free-running diodes. The inverter 98 generates a rotary current system with variable frequency and sine-shaped flows to feed a connection induction motor 100 from the constant intermediate circuit voltage.

The power supply 70 of the converter consists of a switching power section which is connected both with the rotary current network and with the intermediate circuit, uncoupled via diodes. In this way, it is possible to buffer the power supply from the intermediate circuit.

Via the control module 72, the control signals generated by the control are converted into corresponding on/off commands for the transistors of the inverter 98, separated by potential. The functions "sequence control and operation," "field-oriented regulation" and "subordinate phase current regulation" are brought together in the control and regulation module 74, which is housed in an electronics box 102. In addition, there are a control terminal strip, an interface to the control panel and a standard interface on this module 74.

The components 70–86 and 96 of this inverter are mounted on a circuit board and form an electrical module 104, which is shown only by a broken line in FIG. 4. This electrical module 104 is pre-assembled separately. This pre-assembled electrical module 104 is inserted into the access opening 2 of the housing with the component side facing inwards. The power components 92 and 98 and the pre-loading relay 86 have already been assembled on the cooling element 16 in the die-cast housing, or in the case of power converter devices with less output, the power components 92 and 98 have also already been assembled on the circuit board 104. The electronics box 102 with the control and regulation module 74 has also already been assembled in the front part of the housing. The electrical module 104 is fixed and held in place in the housing by means of the capacitors 96 and the power connection terminals 106 and 108, so that this module 104 can be attached in removable manner at two points (ejector points 64), without any additional centering devices. The cover 10 is provided with a further opening 110 so that the connections for the external power supply and the auxiliary contactor control can be passed out of the interior of the housing. FIG. 4 also shows the position of the front cover with a broken line 112. Access to the electronics box 102 is afforded by moving the front cover out of the way so that additional optional modules can be plugged into the electronics box 102. The solder side of the electrical module 104 is provided with a cover of insulating material before the removable side cover of metal is screwed onto the die-cast housing.

Figure 5:
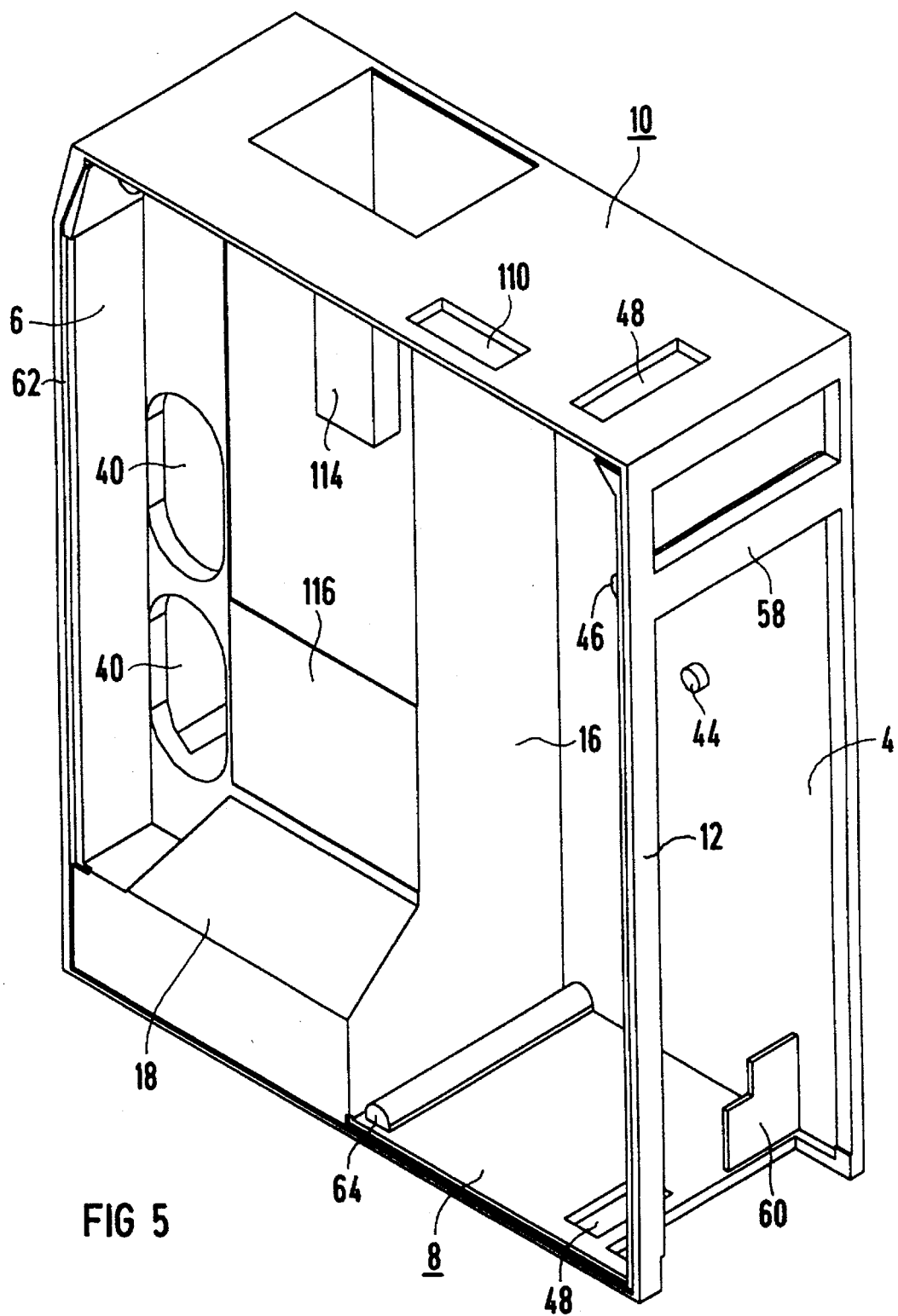
FIG. 5 shows an embodiment of a size II housing according to the present invention, of a compact device.

FIG. 5 shows a die-cast housing according to the invention for a compact device, size II, in a schematic representation. Some elements of the die-cast housing, such as the cooling ribs 14, the perforations 36, 38 and 50 are considered part of the embodiment but are not shown in FIGS. 5 to 8, since these figures only serve to point out the differences as compared with the compact device, size I of FIGS. 1 and 4. The difference from the die-cast housing for a compact device, size I according to FIG. 1 consists of the fact that first of all, the width of the size II device is much greater. Likewise, the side wall 4 is provided with a reinforcement strut 60, also called a stiffener, at the front edge. The cooling element 16 is provided with a base 114 for the power semiconductor module of the rectifier 92, and with a slight elevation 116 for the power semiconductor module of the inverter 98. This base 114 and the elevation 116 serve to equalize the distance between the module connected in electrically conductive manner with the electrical module 104, and the cooling element 16.

Figure 6:
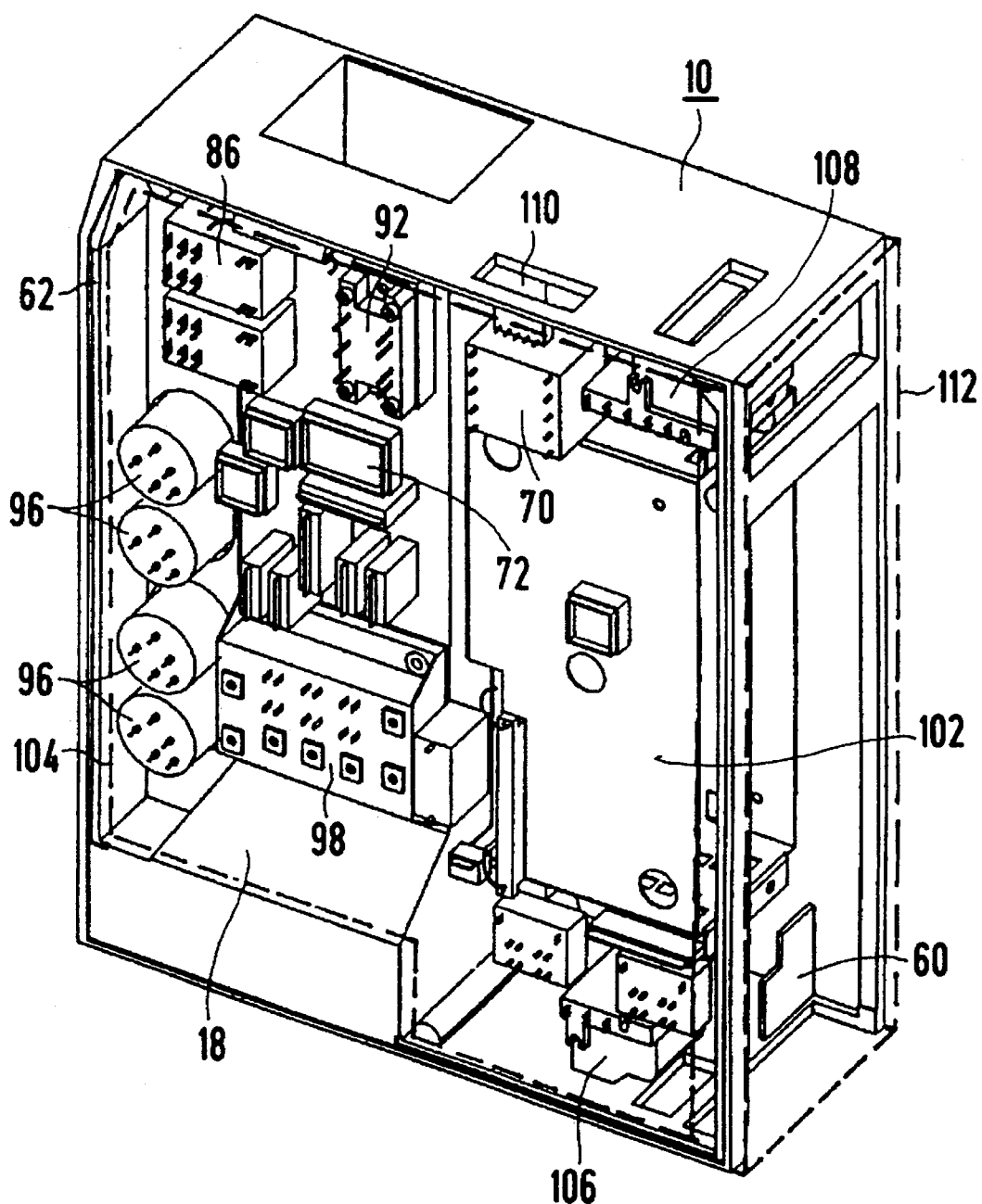
FIG. 6 shows the housing according to FIG. 5 in a partially assembled state.
Figure 7:
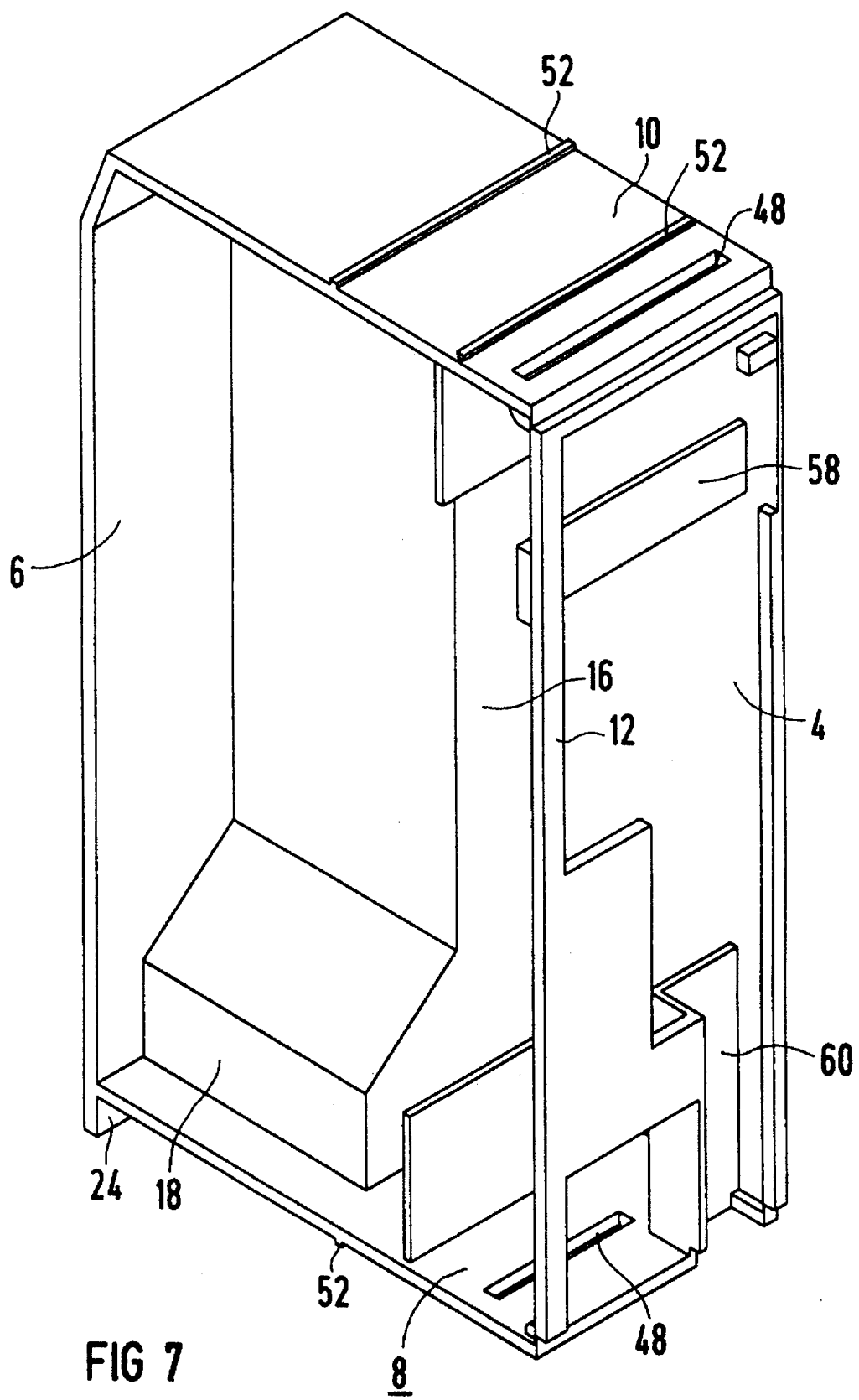
FIG. 7 shows the housing of a compact device, size III.
Figure 8:
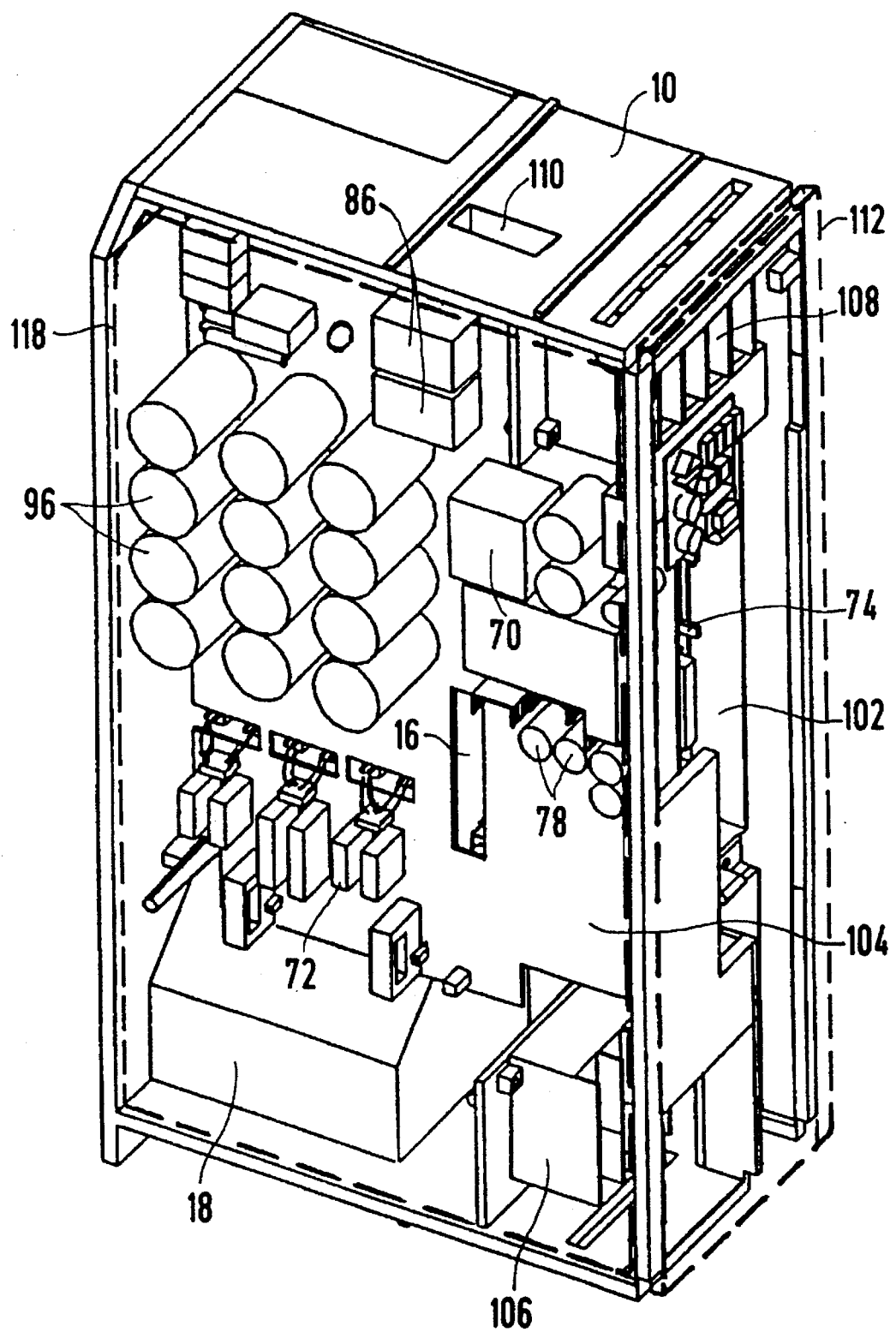
FIG. 8 shows the housing, size III, in the partially assembled state.

It is evident from FIG. 6 that the size II of the compact device is intended for a higher power class, since the individual components of the control device 66 require more space than in the size I according to FIG. 4. This can be seen particularly well in FIGS. 7 and 8. In these schematic representations, it again was not important to represent the housing, i.e. the compact device in all details, but only to show the differences as compared with the housing of a compact device, size I, according to FIG. 1 or 4. In FIG. 8, the position of the side cover of the housing is illustrated with a broken line 118.

In accordance with the present invention, this housing significantly reduces assembly time and effort, and final assembly is further facilitated easy, by using pre-assembled components of the control device.

What is claimed is:

1. A die cast housing to hold a control device that is equipped with heat-producing components, comprising
   a side wall;
   a rear wall;
   a bottom;
   a cover;
   a front strut;
   a cooling element;
   an air guide device coupled to said cooling element;
   a cover plate; and
   a front cover;
   wherein the cooling element includes cooling ribs that run parallel to said rear wall, end in the plane of said side wall and are covered with a bulkhead plate, said cooling ribs forming cooling channels that are open on a frontal side and begin at the air guide device connected with the bottom, and end at the cover;
   wherein said cover and said bottom are each provided with perforations in the region of the front housing half for removing heat from this housing half and an opening to pass through connection lines; and
   wherein said front strut between the bottom and the cover is structured as a lateral frame part for the cover plate which covers a lateral access opening of the housing in removable manner and for the front cover which can close off the one front-side opening of the housing.

2. The housing of claim 1, wherein said rear wall is provided with a hanger in a top part and with an attachment at said bottom part.

3. The housing of claim 1, further comprising an additional separate cooling channel arranged between the cooling element and the rear wall of the die-cast housing with at least one holder device for components of a control device to be cooled projects into this cooling channel, and wherein the bottom and the cover are each provided with perforations in the region of the separate cooling channel.

4. The housing of claim 1, wherein a molded part which is provided with an opening for passing through connection lines is arranged in the die-cast housing next to the air guide device.

5. The housing of claim 1, wherein two stays, at a distance from one another, are each arranged on an inside of the side wall of the die-cast housing, in the region of the openings for passing through connection lines.

6. The housing of claim 1, wherein the inside of the side wall of the die-cast housing has connection domes to attach components of the control device.

7. The housing of claim 1, wherein said front strut is structured in such a way that a rotating hinge of said front cover can be attached to it.

8. The housing of claim 1, wherein an electronics box is attached in the front housing region, in such a way that a frontal opening of the box runs parallel to the frontal opening of the housing.

9. The housing of claim 1, wherein an electrical module is inserted into the access opening of the housing, which is closed by said cover plate and wherein the heat-producing electrical components of the control device to be electrically conductive, and wherein a plate of insulating material is arranged between said circuit board of this electrical module and the cover plate.

10. The housing of claim 1, wherein the bottom and the cover of the die-cast housing each have a contact rib with an adjacent threaded bore parallel to the opening, to pass through connection lines.

11. The housing of claim 1, wherein the bottom and the cover of the die-cast housing are provided with a support shoulder on the circumference and a threaded bore.

12. The housing of claim 1, wherein said cover plate rests against a continuous shoulder around the circumference, along the access opening.

13. The housing of claim 1, wherein two hooks which lie in the plane of the rear wall of the die-cast housing are provided as the hanger.

14. The housing of claim 1, wherein a control panel is housed in said front cover.

15. The housing of claim 1, wherein said cover plate is made of metal.

16. The housing of claim 1, wherein the opening in the bottom is provided with a grate cover in the vicinity of the air guide device.

17. The housing of claim 1, wherein a fan can be located at the entrance of the air guide device and its connections can be located in a recess located next to said air guide device.

18. The housing of claim 2, wherein a flange is provided as the attachment.

* * * * *